(12) United States Patent
Yin et al.

(10) Patent No.: US 7,723,168 B2
(45) Date of Patent: May 25, 2010

(54) METHOD OF MANUFACTURING A STACKED TRANSISTOR HAVING A POLYCRYSTALLINE SI FILM

(75) Inventors: Huaxiang Yin, Yongin-si (KR); Takashi Noguchi, Seongnam-si (KR); Wenxu Xianyu, Yongin-si (KR); Kyung-bae Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/283,874

(22) Filed: Nov. 22, 2005

(65) Prior Publication Data
US 2006/0134894 A1    Jun. 22, 2006

(30) Foreign Application Priority Data
Dec. 17, 2004   (KR) .................... 10-2004-0108031

(51) Int. Cl.
*H01L 21/00*    (2006.01)
(52) U.S. Cl. ................ 438/166; 257/E21.133; 257/E21.134
(58) Field of Classification Search .......... 438/386, 438/166, 487; 349/42, 43, 138; 257/E21.133, 257/E21.134
See application file for complete search history.

(56) References Cited

U.S. PATENT DOCUMENTS

| | | | | |
|---|---|---|---|---|
| 4,609,407 A | * | 9/1986 | Masao et al. | 438/155 |
| 6,566,711 B1 | * | 5/2003 | Yamazaki et al. | 257/347 |
| 6,620,659 B2 | * | 9/2003 | Emmma et al. | 438/154 |
| 6,756,258 B2 | * | 6/2004 | Zhang et al. | 438/158 |
| 2002/0021402 A1 | * | 2/2002 | Hirabayashi et al. | 349/187 |
| 2002/0024102 A1 | * | 2/2002 | Lee et al. | 257/369 |
| 2003/0096460 A1 | * | 5/2003 | Nakajima et al. | 438/149 |
| 2003/0197007 A1 | * | 10/2003 | Kim et al. | 219/635 |
| 2004/0214425 A1 | * | 10/2004 | Lin et al. | 438/629 |
| 2004/0219722 A1 | * | 11/2004 | Pham et al. | 438/157 |

* cited by examiner

*Primary Examiner*—David Vu
(74) *Attorney, Agent, or Firm*—Harness, Dickey & Pierce, PLC

(57) ABSTRACT

A method of manufacturing a polycrystalline Si film and a method of manufacturing a stacked transistor are provided. The method of manufacturing the polycrystalline Si film includes preparing an insulating substrate on which is formed a transistor that includes a poly-Si active layer, a gate insulating layer, and a gate, sequentially formed, forming an interconnection metal line separated from the gate, forming an insulating layer that covers the transistor and the interconnection metal line, forming an amorphous silicon layer on the insulating layer; and annealing the amorphous silicon layer.

17 Claims, 7 Drawing Sheets

METHOD OF MANUFACTURING A STACKED TRANSISTOR HAVING A POLYCRYSTALLINE SI FILM

CROSS-REFERENCE TO RELATED PATENT APPLICATIONS

This application claims the benefit of Korean Patent Application No. 10-2004-0108031, filed on Dec. 17, 2004, in the Korean Intellectual Property Office, the disclosure of which is incorporated herein in its entirety by reference.

BACKGROUND OF THE DISCLOSURE

1. Field of the Disclosure

The present disclosure relates to a method of manufacturing a high mobility polycrystalline Si film and a method of manufacturing a stacked transistor using the polycrystalline Si film.

2. Description of the Related Art

Polycrystalline Si, or "poly-Si", is widely used in devices such as flat panel displays and solar cells, since poly-Si has greater mobility than a-Si (amorphous Si). Generally, polycrystalline Si electronic devices are formed on a substrate that has a high resistance to heat. However, recently, methods of manufacturing polycrystalline Si electronic devices on plastic substrates have been investigated. To avoid damaging the plastic, low temperature processes are needed to form these polycrystalline Si electronic devices. The low temperature is required not only to prevent thermal impact to the substrate, but also to reduce process defects caused by the conventional high temperature process. Plastic substrates for flat display devices have been studied, since plastic is flexible, light, and strong.

Poly-Si thin film transistors (TFTs) are known as devices that can be formed on a plastic substrate meeting the requirements. However, the poly-Si TFTs must be manufactured at a low temperature, to protect the plastic substrate.

Recently, an S3 static random access memory (SRAM) in a three dimensional structure has been developed, using a stacked transistor structure.

The size of a conventional SRAM cell is 80-90 $F^2$ (F: feature size). However, the size of a single stack of the S3 SRAM cell in a three-dimensional structure is 46 $F^2$, and the size of a double stack is 25 $F^2$, which are ½-⅓ of the conventional sizes. This increases the versatility of SRAM, by increasing the capacity while maintaining the inherent characteristics such as low stand-by current and high speed.

The attempts to reduce chip size by manufacturing semiconductor devices in three dimensional structures continue. However, there is a need to develop techniques to simplify manufacturing processes and reduce cost.

SUMMARY OF THE DISCLOSURE

The present invention may provide a method of manufacturing a polycrystalline Si film having high mobility, and a method of manufacturing a stacked transistor using the polycrystalline Si film.

According to an aspect of the present invention, there may be provided a method of manufacturing a polycrystalline Si film, the method comprising: preparing an insulating substrate on which is formed a transistor that includes a poly-Si active layer, a gate insulating layer, and a gate, sequentially formed; forming an interconnection metal line at a predetermined distance from the gate; forming an insulating layer that covers the transistor and the interconnection metal line; forming an amorphous silicon layer on the insulating layer; and annealing the amorphous silicon layer.

The annealing of the amorphous silicon layer can include forming a polycrystalline Si film crystallized in lateral directions on the insulating layer between the transistor and the interconnection metal line by annealing the amorphous silicon layer.

According to another aspect of the present invention, there is provided a method of manufacturing a stacked transistor, the method comprising: preparing an insulating substrate on which is formed a transistor that includes a poly-Si active layer, a gate insulating layer, and a gate, sequentially formed; forming an interconnection metal line at a predetermined distance from the gate; forming an insulating layer that covers the transistor and the interconnection metal line; forming an amorphous silicon layer on the insulating layer; forming a polycrystalline Si film crystallized in lateral directions on the insulating layer between the transistor and the interconnection metal line by annealing the amorphous silicon layer; and forming a transistor that includes a poly-Si active layer, a gate insulating layer, and a gate using the polycrystalline Si film.

The preparing of an insulating substrate on which a transistor is formed can include preparing an insulating substrate and forming a transistor that includes a poly-Si active layer, a gate insulating layer, and a gate, sequentially formed.

The forming of the insulating layer that covers the transistor and the interconnection metal line can further include planarizing the insulating layer after forming the insulating layer.

The amorphous silicon layer can be annealed using a laser beam.

The insulating substrate can be a glass substrate or a plastic substrate, and the gate and the interconnection metal line can each be formed of a material having high thermal conductivity. The interconnection metal line can be formed of a metal selected from the group consisting of Al, Cr, Cu, and Mo, and the interconnection metal line can be formed parallel to the gate.

BRIEF DESCRIPTION OF THE DRAWINGS

The above and other features and advantages of the present invention will be described in exemplary embodiments thereof with reference to the attached drawings in which.

DETAILED DESCRIPTION OF EXEMPLARY EMBODIMENTS

A method of manufacturing a polycrystalline Si film and a method of manufacturing a stacked transistor according to the present invention will now be described with reference to the accompanying drawings, in which exemplary embodiments of the invention are shown. Like reference numerals refer to like elements throughout the drawings.

Figure 1A:
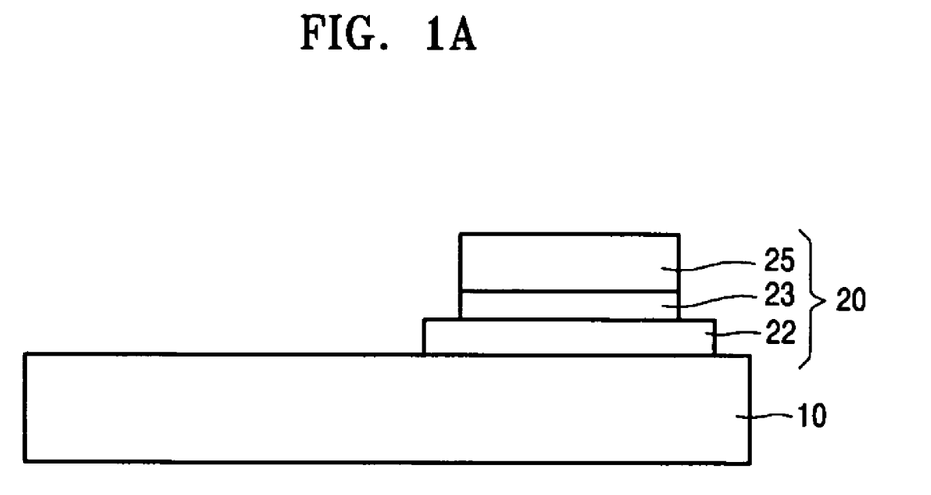
FIGS. 1A through 1F are cross-sectional views illustrating a method of manufacturing a polycrystalline Si film according to a first embodiment of the present invention.
Figure 1B:
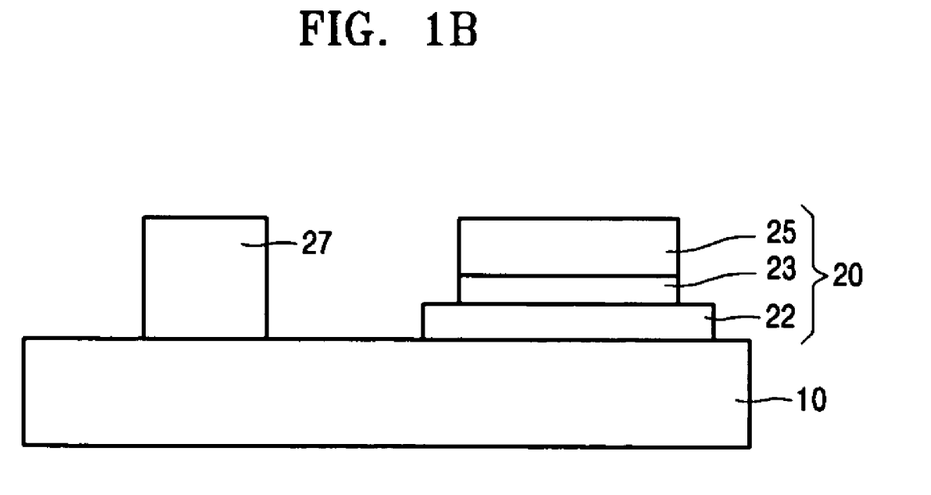
Figure 1C:
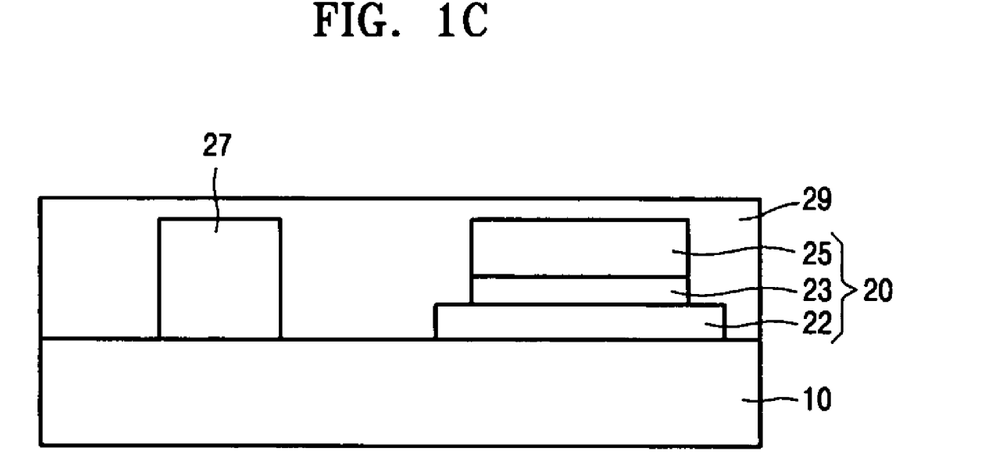
Figure 1D:
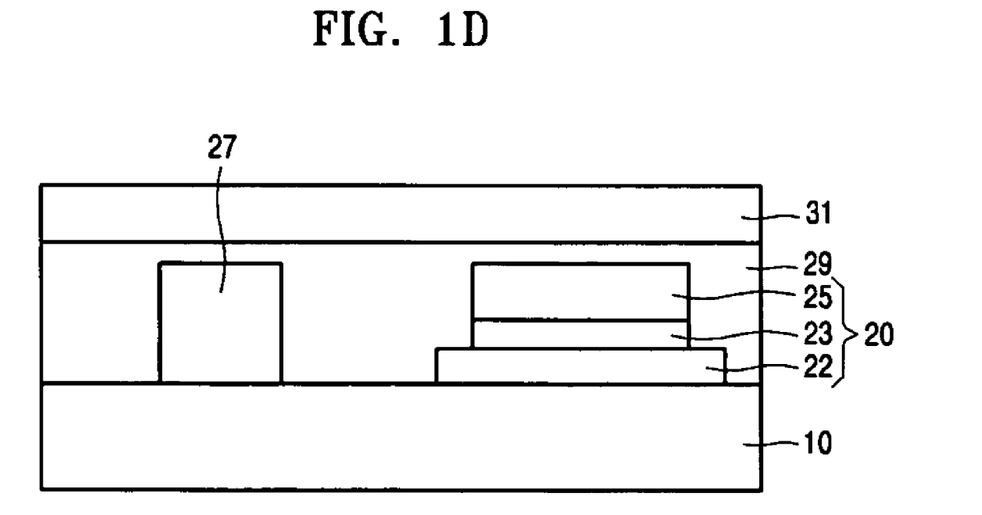
Figure 1E:
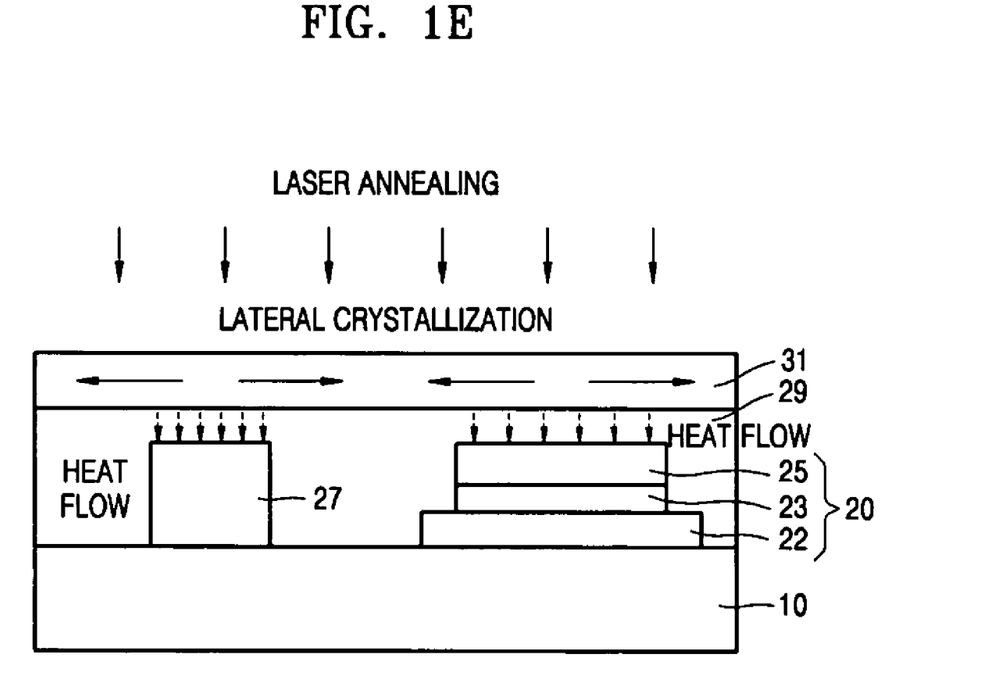
Figure 1F:
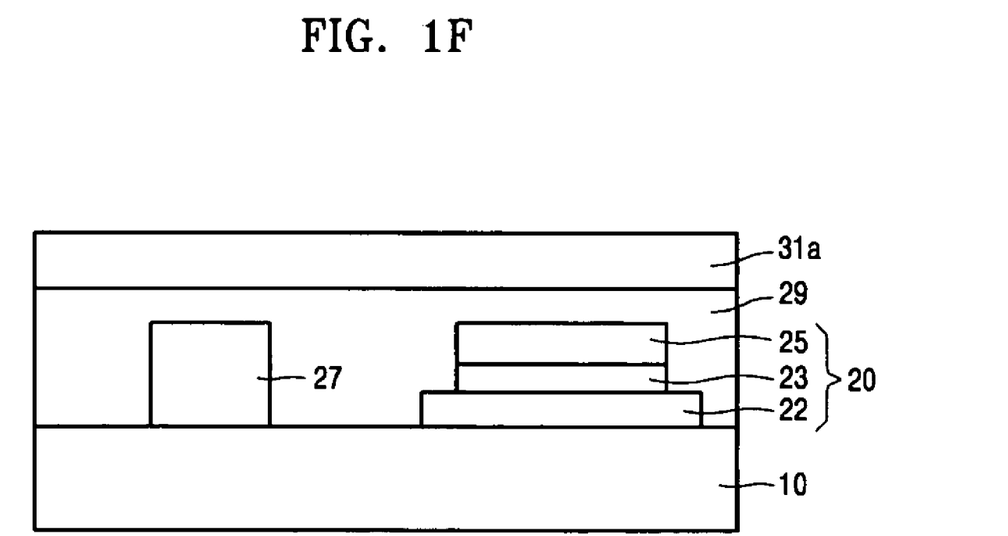
Figure 2:
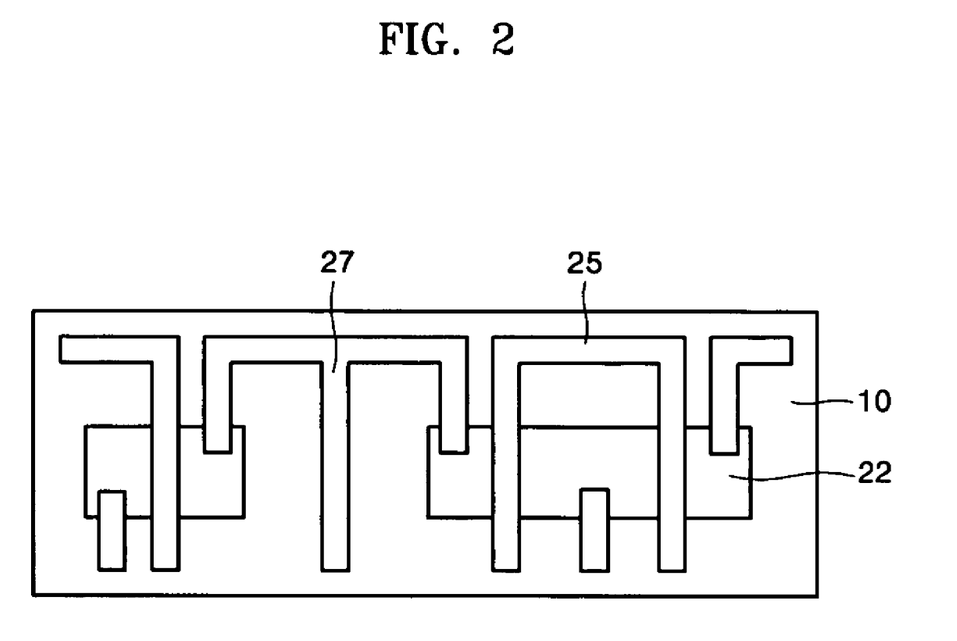
FIG. 2 is a plan view of FIG. 1B.

FIGS. 1A through 1F are cross-sectional views illustrating a method of manufacturing a polycrystalline Si film according to a first embodiment of the present invention, and FIG. 2 is a plan view of FIG. 1B.

Referring to FIG. 1A, an insulating substrate 10 is prepared. A transistor 20 that includes a poly-Si active layer 22, a gate insulating layer 23, and a gate 25 is formed on the insulating substrate 10 after preparation. The poly-Si active layer 22 includes a source and drain (not shown) and a channel (not shown) formed between the source and drain. Here, the insulating substrate 10 can be glass or plastic. Next, as depicted in FIG. 1B, an interconnection metal line 27 is formed at a predetermined distance from the gate 25. Here, the interconnection metal line 27 and the gate 25 are formed of a material having a high electric conductivity and an especially high thermal conductivity. The interconnection metal line 27 is formed of Al, Cr, Cu, or Mo. Al, Cr, Cu, and Mo are also metals for forming the gate 25. Therefore, the interconnection metal line 27 and the gate 25 can be formed at the same time in a single process of deposition and patterning. The interconnection metal line 27 is formed parallel to the gate 25.

Next, referring to FIGS. 1C and 1D, an insulating layer 29 is formed covering the transistor 20 and the interconnection metal line 27, and an amorphous silicon layer 31 is formed on the insulating layer 29. Here, a planarization process for planarizing the insulating layer 29 can further be performed prior to forming the amorphous silicon layer 31.

Next, referring to FIG. 1E, the amorphous silicon layer 31 is annealed using a laser such as an excimer laser. The amorphous silicon layer 31 absorbs the laser energy and is crystallized by repeating heating and cooling during the annealing process. At this time, since the gate 25 and the interconnection metal line 27 are formed of a material having high thermal conductivity, they absorb heat. Therefore, seed grains are generated on the transistor 20 and the interconnection metal line 27, and the seed grains can expand to laterals. In this manner, lateral crystallization of the amorphous silicon layer 31 can progress on the insulating layer 29 between the transistor 20 and the interconnection metal line 27.

Referring to FIG. 1F, a polycrystalline Si film 31a, crystallized in lateral directions, can be obtained on the insulating layer 29 between the transistor 20 and the interconnection metal line 27, by annealing the amorphous silicon layer 31.

Figure 3:
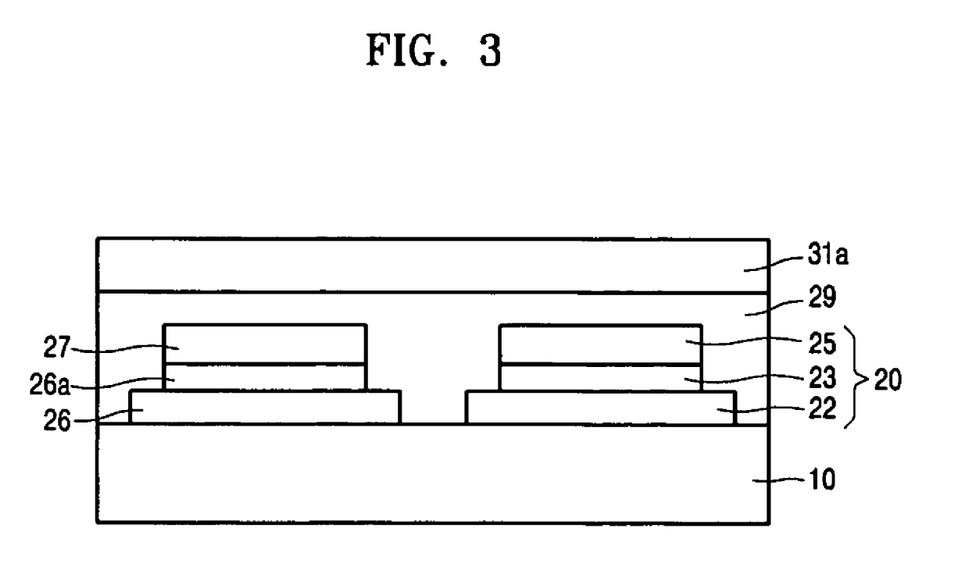
FIG. 3 is a cross-sectional view illustrating a method of manufacturing a polycrystalline Si film according to a second embodiment of the present invention.

FIG. 3 is a cross-sectional view illustrating a method of manufacturing a polycrystalline Si film according to a second embodiment of the present invention.

The method of manufacturing a polycrystalline Si film according to the second embodiment is similar to that of the first embodiment, except that in the second embodiment, a poly-Si active layer 26 and a gate insulating layer 26a are further included between the insulating substrate 10 and the interconnection metal line 27. Here, the interconnection metal line 27 acts as a gate electrode.

The polycrystalline Si film is readily obtained by the methods according to the present invention, and the polycrystalline Si film has high mobility since it has very few grain boundaries.

The method of manufacturing the polycrystalline Si film can be directly applied to manufacturing a stacked transistor for a stacked static random access memory (SRAM) device. The method of manufacturing a stacked transistor for a stacked SRAM device will now be described.

Figure 4A:
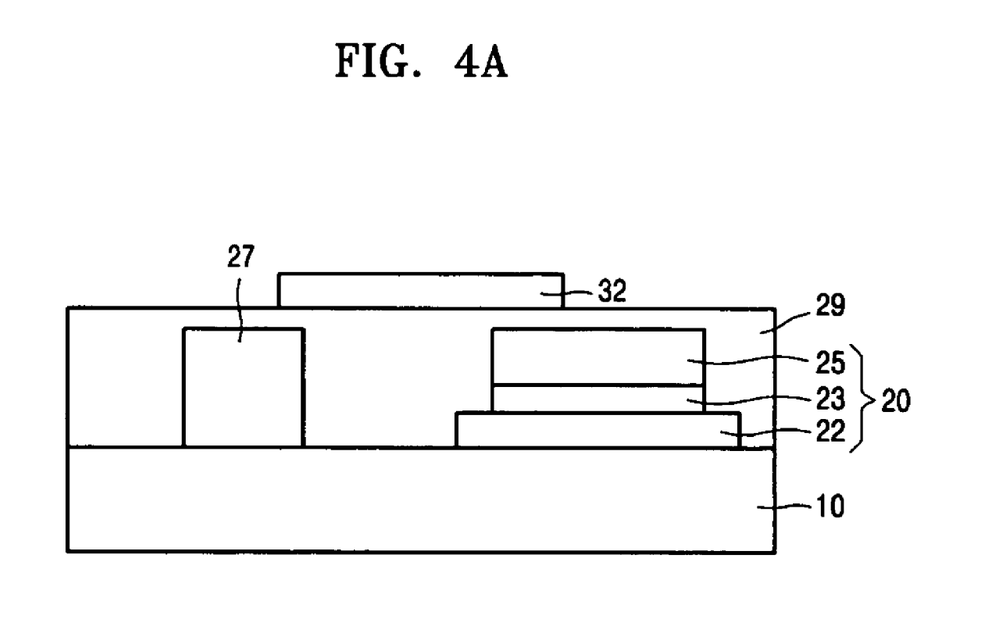
FIGS. 4A through 4C are cross-sectional views illustrating a method of manufacturing a stacked transistor according to the first embodiment, using the polycrystalline Si film of FIG. 1F.
Figure 4B:
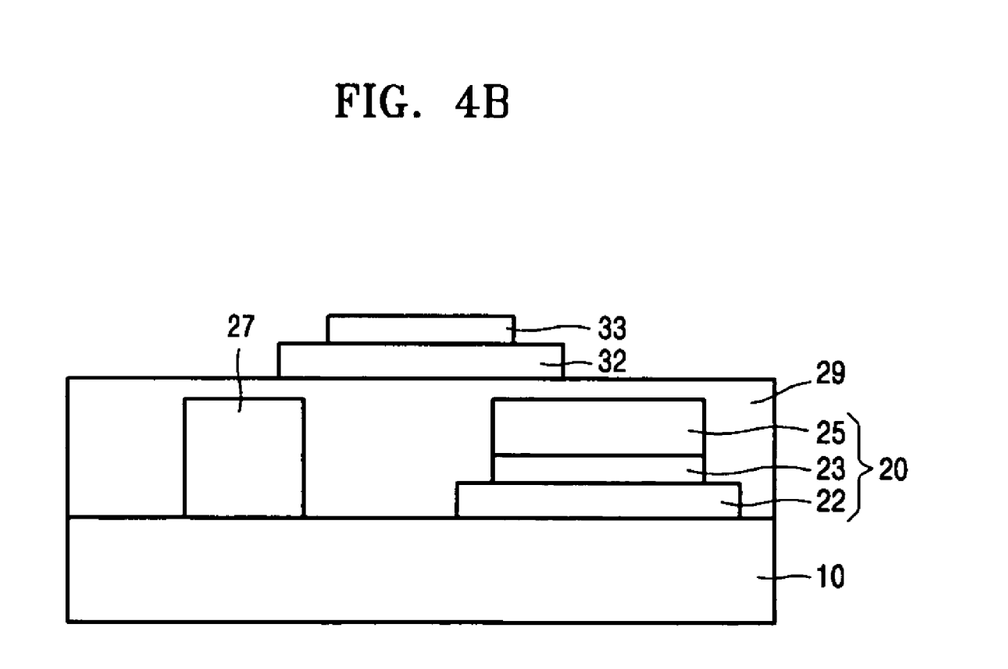
Figure 4C:
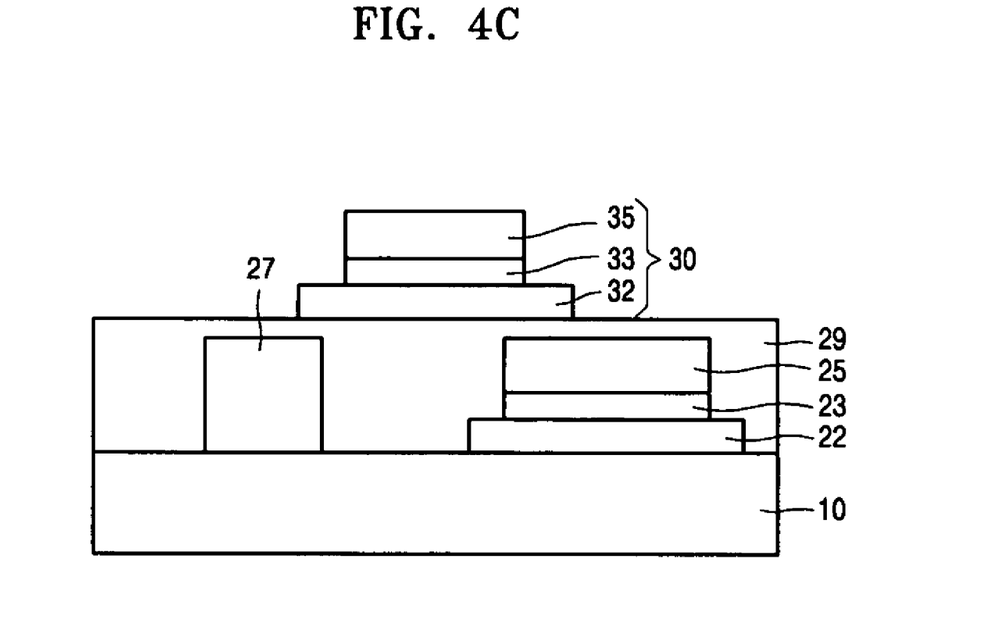

FIGS. 4A through 4C are cross-sectional views illustrating a method of manufacturing a stacked transistor according to the first embodiment of the present invention, using the polycrystalline Si film of FIG. 1F.

Referring to FIGS. 4A through 4C, a poly-Si active layer 32 is formed by patterning the polycrystalline Si film 31a depicted in FIG. 1F to a predetermined width. The poly-Si active layer 32 includes a source and drain (not shown) and a channel (not shown) between the source and drain.

Next, a gate insulating layer 33 and a gate 35 are sequentially formed on the poly-Si active layer 32. In this manner, a stacked structure of an upper transistor 30 on a lower transistor 20 can be manufactured. Here, the interconnection metal line 27 is a conductive line that connects the stacked transistor devices to each other. A semiconductor memory device, such as an SRAM device, can be manufactured when the transistor devices are connected by the interconnection metal line 27.

Figure 5:
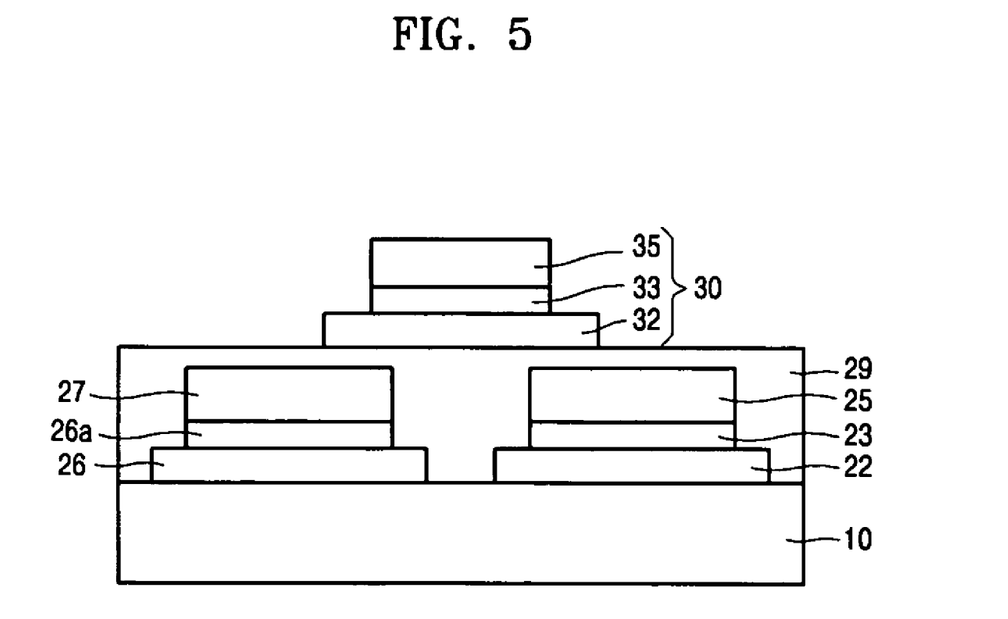
FIG. 5 is a cross-sectional view illustrating a method of manufacturing a stacked transistor according to the second embodiment, using the polycrystalline Si film of FIG. 3.

FIG. 5 is a cross-sectional view illustrating a method of manufacturing a stacked transistor according to the second embodiment of the present invention, using the polycrystalline Si film of FIG. 3.

The method of manufacturing a stacked transistor according to the second embodiment is similar to that of the first embodiment, except that in the second embodiment, a poly-Si active layer 26 and a gate insulating layer 26a are further formed between the insulating substrate 10 and the interconnection metal line 27. Here, the interconnection metal line 27 acts as a gate electrode.

Figure 6:
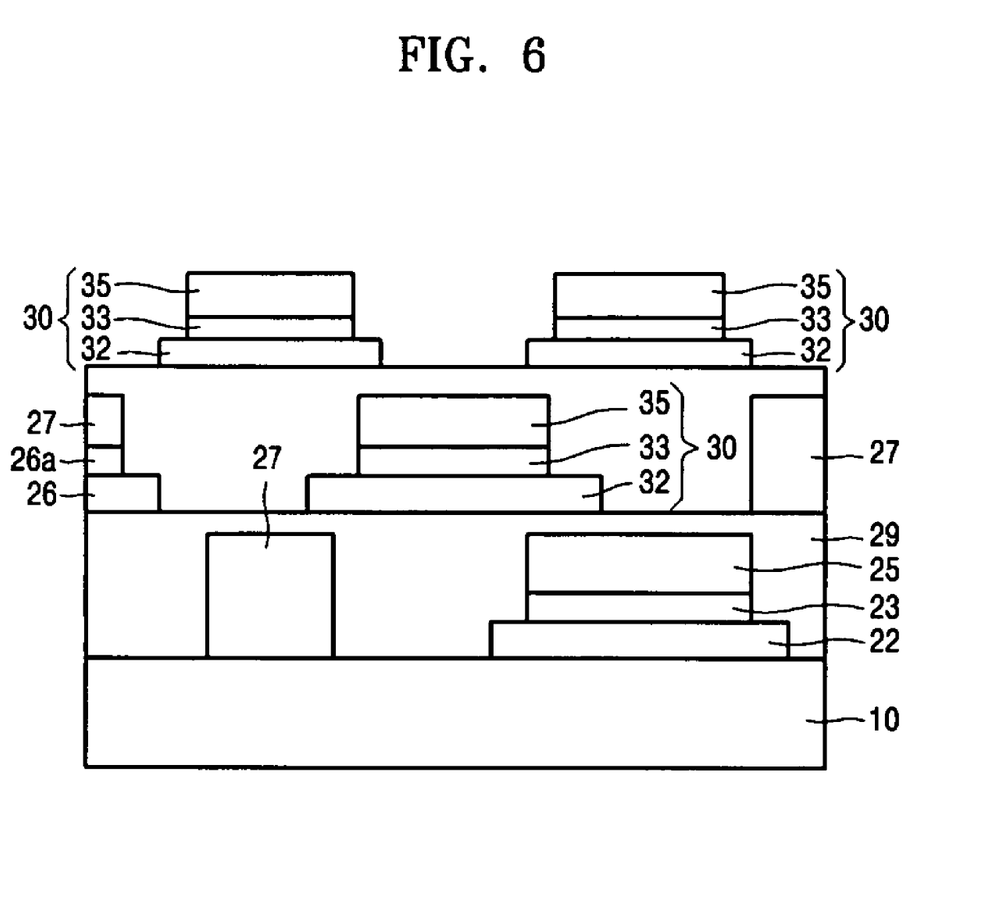
FIG. 6 is a cross-sectional view illustrating a method of manufacturing a stacked transistor according to a third embodiment of the present invention, using the methods of manufacturing the polycrystalline Si film according to the first and second embodiments of the present invention.

FIG. 6 is a cross-sectional view illustrating a method of manufacturing a stacked transistor according to a third embodiment of the present invention, using the methods of manufacturing the polycrystalline Si film according to the first and second embodiments.

According to the present invention, the process for manufacturing the polycrystalline Si film is simple, thereby reducing the manufacturing cost. Also, a high quality polycrystalline Si film can be formed on a glass or plastic substrate which is sensitive to high temperatures. Also, the method of manufacturing a polycrystalline Si film can be directly applied to the manufacture of a stacked transistor used for a stacked SRAM device. The method of manufacturing a stacked transistor can simplify the manufacturing process, thereby reducing cost.

The methods of manufacturing a polycrystalline Si film according to the present invention are especially suited for the manufacture of flat display devices, such as AMLCDs and AMOLEDs, solar cells, and any semiconductor memory devices that use a plastic substrate. The polycrystalline Si film is especially useful for TFTs that require high mobility and speedy response, and TFTs that use a plastic substrate. The TFTs can be applied to any electronic device that uses TFTs as a switching device or an amplifying device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a polycrystalline Si film, the method comprising:

preparing an insulating substrate on which is formed a transistor that includes a poly-Si active layer, a gate insulating layer, and a gate, sequentially formed;

forming an interconnection metal line at a distance from the gate, the top of the interconnection metal line and the top of the gate having about a same height;

forming an insulating layer that covers the transistor and the interconnection metal line;

forming an amorphous silicon layer on the insulating layer; and annealing the amorphous silicon layer prior to patterning, which generates seed grains expanding laterally on the transistor and the interconnection metal line by heat absorption of the gate and the interconnection metal line, and then forms a polycrystalline Si film crystallized in lateral directions on the insulating layer between the transistor and the interconnection metal line.

2. The method of claim 1, wherein the amorphous silicon layer is annealed using a laser beam.

3. The method of claim 1, wherein the forming of the insulating layer that covers the transistor and the interconnection metal line further includes planarizing the insulating layer after forming the insulating layer.

4. The method of claim 1, wherein the insulating substrate is a glass substrate or a plastic substrate.

5. The method of claim 1, wherein the gate and the interconnection metal line are each formed of a material having high thermal conductivity.

6. The method of claim 5, wherein the interconnection metal line is formed of at least one metal selected from the group consisting of Al, Cr, Cu, and Mo.

7. The method of claim 1, wherein the interconnection metal line is formed parallel to the gate.

8. A method of manufacturing a stacked transistor, the method comprising:

preparing an insulating substrate on which is formed a transistor that includes a poly-Si active layer, a gate insulating layer, and a gate, sequentially formed;

forming an interconnection metal line at a predetermined distance from the gate;

forming an insulating layer that covers the transistor and the interconnection metal line;

forming an amorphous silicon layer on the insulating layer;

forming a polycrystalline Si film crystallized in lateral directions on the insulating layer between the first transistor and the interconnection metal line by annealing the amorphous silicon layer which generates seed grains expanding laterally on the transistor and the interconnection metal line; and forming a second transistor with the polycrystalline Si film that includes a poly-Si active layer, a gate insulating layer, and a gate, using the polycrystalline Si film, wherein the gate and the interconnection metal line are each formed of a material having high thermal conductivity, the second transistor is formed on the insulating layer, and the second transistor is formed between the first transistor and the interconnection metal line.

9. The method of claim 8, wherein the amorphous silicon layer is annealed using a laser beam.

10. The method of claim 8, wherein the forming of the insulating layer that covers the first transistor and the interconnection metal line further includes planarizing the insulating layer after forming the insulating layer.

11. The method of claim 8, wherein the insulating substrate is a glass substrate or a plastic substrate.

12. The method of claim 8, wherein the interconnection metal line is formed of at least one metal selected from the group consisting of Al, Cr, Cu, and Mo.

13. The method of claim 8, wherein the interconnection metal line is formed parallel to the gate.

14. The method of claim 8, wherein a plurality of first transistors are formed, a gate of at least one of the plurality of first transistors is the interconnection metal line, and the second transistor is formed on the insulating layer between two adjacent transistors of the plurality of first transistors.

15. The method of claim 8, comprising:

forming another interconnection metal line at a predetermined distance from the second transistor on the insulating layer;

forming another insulating layer that covers the second transistor and the other interconnection metal line; and forming a third transistor on the other insulating layer between the second transistor and the other interconnection metal line, wherein a channel layer of the third transistor is formed using the same method as that of manufacturing the polycrystalline Si film.

16. The method of claim 15, wherein a plurality of first transistors are formed, a gate of at least one of the plurality of first transistors is the interconnection metal line; and the second transistor is formed on the insulating layer between two adjacent transistors of the plurality of first transistors.

17. The method of claim 16, wherein a plurality of second transistors are formed, a gate of at least one of the plurality of second transistors is the other interconnection metal line, and the third transistor is formed on the other insulating layer between two adjacent transistors of the plurality of second transistors.

* * * * *